United States Patent [19]

Walker

[11] Patent Number: 4,884,041
[45] Date of Patent: Nov. 28, 1989

[54] FULLY INTEGRATED HIGH-SPEED VOLTAGE CONTROLLED RING OSCILLATOR

[75] Inventor: Richard C. Walker, Palo Alto, Calif.

[73] Assignee: Hewlett-Packard Company, Palo Alto, Calif.

[21] Appl. No.: 58,477

[22] Filed: Jun. 5, 1987

[51] Int. Cl.⁴ .............................................. H03B 5/00
[52] U.S. Cl. ....................................... 331/57; 331/111
[58] Field of Search .......................... 331/57, 111, 143

[56] References Cited

PUBLICATIONS

"Gigahertz Voltage-Controlled Ring Oscillator", Electronics Letters, Jun. 5, 1986, vol. 22, No. 12.

Primary Examiner—Eugene R. LaRoche
Assistant Examiner—Robert J. Pascal
Attorney, Agent, or Firm—John A. Frazzini

[57] ABSTRACT

An N ring element ring oscillator merged with an M element ring oscillator by using a linear combining circuit. By adjusting the control voltage, the oscillation frequency can be varied from $\frac{1}{2}*N*T_d$ (where $T_d$ is a gate delay) to $\frac{1}{2}*M*T_d$. Other embodiments provide extended frequency tuning range.

1 Claim, 7 Drawing Sheets

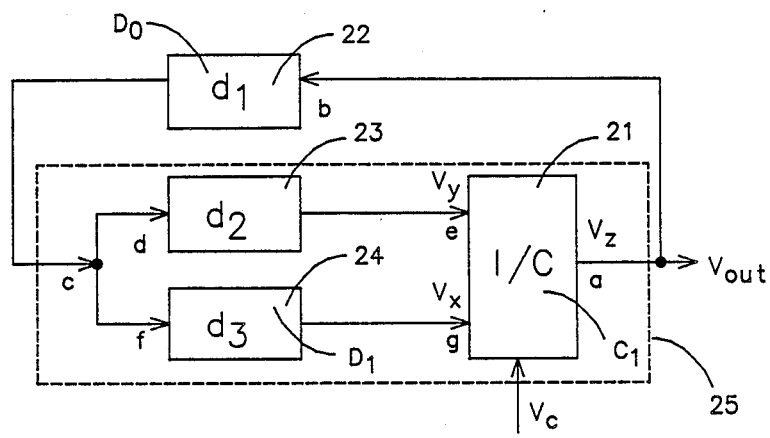
FIG 2
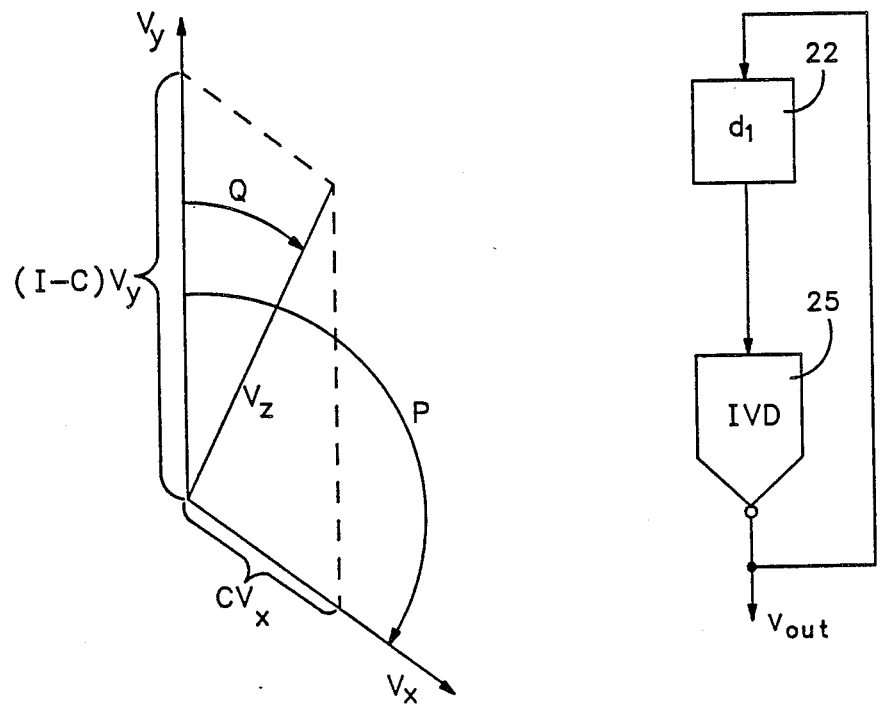
FIG 3
FIG 4

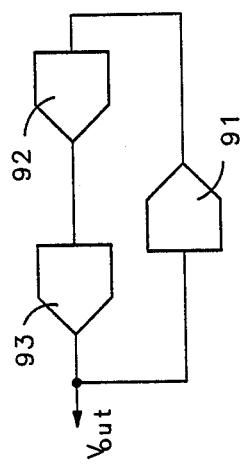
FIG 9
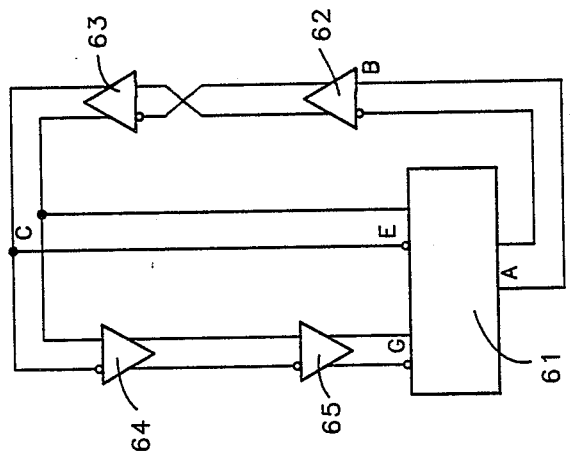
FIG 6
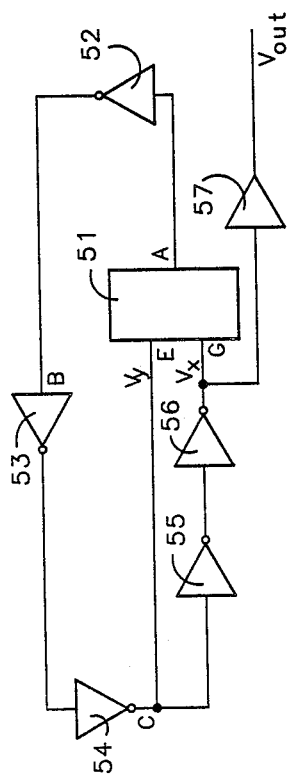
FIG 5
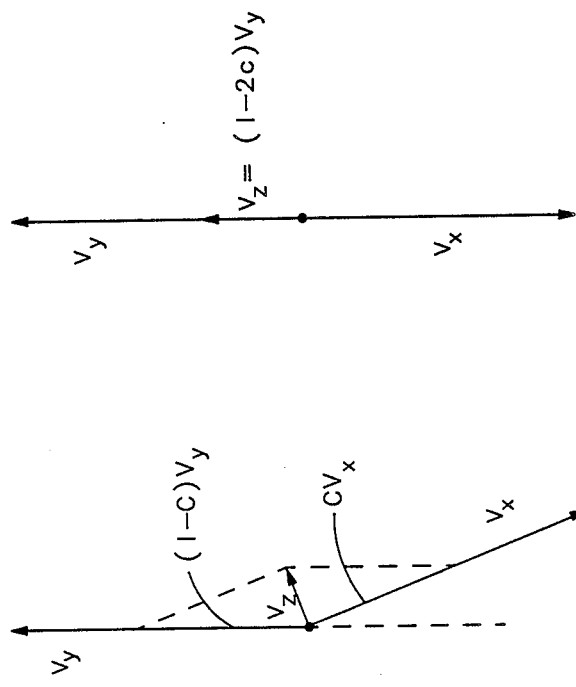
FIG 8
FIG 7

FULLY INTEGRATED HIGH-SPEED VOLTAGE CONTROLLED RING OSCILLATOR

BACKGROUND OF THE INVENTION

This invention relates in general to voltage controlled oscillators and relates in particular to a voltage controlled ring oscillator that can operate at high frequencies and that can be implemented in a small number of elements formed on a single chip. Voltage controlled oscillators are widely used in communication systems. In FIG. 1 is illustrated a conventional ring oscillator. This oscillator consists of an odd number N of inverters, each having a gate delay of $T_d$. If a rising logic edge propagates around the ring it will, after one round trip, become a falling edge. After two such trips, it will again be a rising edge. Since the time of propagation around the loop is $N*T_d$, the period of this signal will be $2N*T_d$. Equivalently, this circuit oscillates at a frequency of $\frac{1}{2}N*T_d$.

Three conditions are required to ensure that this circuit will function as an oscillator. First, the small signal gain of each inverter must be such that the net gain around the loop is greater than 1. When the net gain is greater than 1, the signal on the loop will grow with each pass around the loop until the inverters saturate to a point such that the total gain of the loop drops to 1. Second, there must be an odd number of inversions around the loop. If there were an even number, then the circuit operation could peg at the maximum positive or negative signal achievable at saturation of all inverters and the circuit would not oscillate. Thus, by requiring a net inversion around the ring, it is assured that such saturation at a constant circuit value will not occur. An alternate means of preventing latchup is to provide for an AC coupling in the ring. This method is usually avoided in monolithic IC implementations due to the difficulty in fabricating the required coupling capacitors. Third, N is chosen to be greater than two. According to Nyquist's Stability Criterion, the existence of more than two dominant poles in the circuit transfer function guarantees that the circuit will be unstable. Therefore, N is chosen to be greater than two.

In conventional voltage controlled ring oscillators, the frequency is varied by varying the gate delay $T_d$ of each stage. In one such oscillator, an FET is introduced before each inverter. The control voltage is applied to the gate of each of the FETs to vary the delay of each FET, thereby varying the frequency of the oscillator. In another voltage controlled ring oscillator, voltage controlled bias currents are used for each inverter to modify the rise and fall times of the inverters, thereby varying the gate delay $T_d$ of each inverter. Unfortunately, both of these schemes introduce elements that limit the maximum frequency that can be produced by the oscillator.

For cost reasons, it is always desirable to minimize both the chip count and the number of external parts needed to build a given system. Thus, it would be advantageous to have an oscillator design that utilizes a small number of elements that are compatible so that they can be integrated onto a single chip with other circuits with which the oscillator is to interact without need for external frequency determining elements.

SUMMARY OF THE INVENTION

In the FIGS, the first digit of a 1, 2 or 3 digit reference numeral and the first two digits of a 4 digit reference numeral will indicate the first figure in which that element appears.

In accordance with the illustrated preferred embodiment of the invention, a ring oscillator is presented that utilizes an inverter/combination circuit to introduce a voltage controllable delay into the ring. This inverter/combination circuit produces from an input signal a second signal which is delayed by a fixed amount of delay. A linear combination of this delayed signal and the input signal is produced, the amount of each of the two signals being determined by an applied control voltage. For an input sine wave, the resulting output signal from this inverter/combination circuit is shifted in phase by 180 degrees and is delayed by an amount that is determined by the applied control voltage. This variable controllable delay plus a fixed delay from other elements in the loop determine the period of oscillation of the oscillator. This enables the frequency of oscillation of the oscillator to be varied by an applied control voltage.

When this circuit is inserted into a ring, there results a configuration consisting of two loops. In one limit of operation, the signal in the ring travels around only a first of these loops, referred to as the low frequency loop, and the resulting oscillator frequency is the minimum producible by this oscillator. In the other limit of operation, the signal in the ring travels around only the other of these loops, referred to as the high frequency loop, and the resulting oscillator frequency is the maximum producible by this oscillator. The oscillator frequency varies monotonically between these two frequency extremes as a function of the applied control voltage.

In order to have stable operation of this inverter/combination circuit, the maximum allowable delay produced by this inverter/combination circuit is limited to $\frac{1}{4}*f$. In order to achieve an increased range of frequency tunablility, a plurality of these delay elements are utilized in the oscillator. In one embodiment, a plurality of these inverter/combination elements are coupled in series in a ring. In another embodiment having a larger maximum oscillator frequency, these inverter/combination circuits are combined in a cascade type of arrangement.

DESCRIPTION OF THE FIGURES

FIG. 2 illustrates the general form of the inverter/combination circuit in a voltage controlled ring oscillator.

FIG. 3 illustrates the amount of variable delay produced in the output signal of the inverter/combination as a function of a control parameter C that is determined by an applied control voltage.

FIG. 4 is a simplified block diagram of the circuit of FIG. 2 with the elements within dashed lines 25 in FIG. 2 represented as inverting variable delay element 25 in FIG. 4.

FIG. 5 is a block diagram of a ring oscillator having three inverters in its high frequency loop and 5 inverters in its low frequency loop.

FIG. 6 illustrates the reduction in the amplitude of the output signal $V_z$ of the inverter/combination circuit that can result if the relative phase between $V_x$ and $V_y$ is allowed to approach pi.

FIG. 7 illustrates the responsiveness of the inverter/combination circuit to changes in control parameter C when the phase between $V_x$ and $V_y$ is pi.

FIG. 8 illustrates a ring oscillator in which the high frequency loop utilizes an even number of differential inverters.

FIG. 9 is a block diagram of a ring oscillator utilizing a plurality of inverter/combination circuits connected in series in a loop to achieve a stable oscillator having an extended frequency tuning range.

DESCRIPTION OF THE PREFERRED EMBODIMENT

Figure 1:
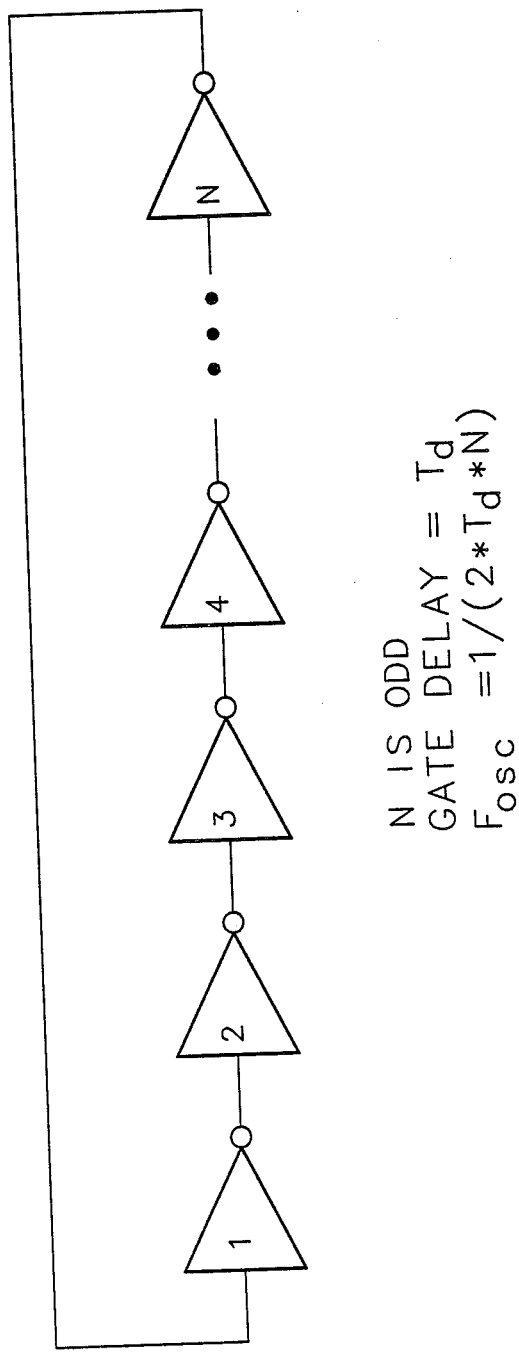
FIG. 1 illustrates a conventional ring oscillator.

In FIG. 2 is shown a block diagram illustrating the operation of this new oscillator. This circuit contains an inverter/combination circuit 21 and three delay elements 22, 23 and 24 which introduce delays of $d_1$, $d_2$, and $d_3$, respectively. Delay element 23 produces a signal $V_y$ at a first input of inverter/combination circuit 21 and delay element 24 produces a signal $V_x$ at a second input of inverter/combination circuit 21. The output signal $V_z$ of inverter/combination circuit 21 is equal to the linear combination $-[C(V_C)*V_x)+D(V_C)*V_y]$ where C and D are functions of an applied control voltage $V_C$. In order monotonic tuning of this oscillator with applied control voltage $V_C$, the functions C and D should be monotonic in $V_C$. In order for the amplitude of $V_z$ to be substantially constant, it is advantageous for C+D to be fairly constant. For the embodiments shown in FIGS. 13 and 14, C+D is substantially constant at a value of 1. Thus, D can be replaced by (1−C) so that this linear combination becomes $-[C*V_x+(1-C)*V_y]$ where C is in the range $0 \leq C \leq 1$. The value of C is determined by a control voltage $V_c$ applied to a control input of inverter/combination circuit 21 and is used to vary the frequency of oscillation of this oscillator.

The relative delay $d_3-d_2$ produces a relative phase shift $P=2*pi*f*D=w*(d_3-d_2)$ of signal $V_x$ relative to signal $V_y$, where f is the frequency of the oscillator and w is the angular frequency of the oscillator. The relationship between the output signal $V_z$ of inverter/combination circuit 21 and its input signals $V_x$ and $V_y$ can be seen by reference to the phasor diagram in FIG. 3. Phase shift P shows up in this phasor diagram as the angle P between $V_x$ and $V_y$ and angle Q shows up as the angle Q between $V_z$ and $V_y$. As C varies from 0 to 1, phase shift Q varies from 0 to P.

This phase shift Q is equivalent to an effective delay of Q/2*pi*f of $V_z$ relative to $V_y$. Therefore, the circuit within dashed line 25 is an inverting variable delay (IVD) element which introduces a phase shift of pi and a delay D which varies from $d_2$ for C=0 to $d_3$ for C=1. Thus, the circuit in FIG. 3 is equivalent to the circuit shown in FIG. 4. Therefore, the frequency of this oscillator is $\frac{1}{2}(d_1+D)$ and is tunable over the range from $1/(d_1+d_2)$ to $1/(d_1+d_3)$. In particular embodiments, any one of the delay elements can be eliminated. Likewise, inverter/combination circuit 21 can be replaced by a combination circuit, that produces a linear combination $V_z=C*V_x+(1-C)*V_y$ plus either an inverter somewhere in path ABC or an inverter in each of paths CDE and CFG.

In FIG. 5 is illustrated an embodiment of the oscillator utilizing a combination circuit 51 and 5 inverters 52-56. Loop ABCGA contains 5 inverters and loop ABCEA contains 3 inverters. Thus, both of these loops contain the required odd number of inversions to serve as a ring oscillator. Inverters 52, 53 and 54 produce the delay $d_1$. Inverters 54 and 55 produce the delay $d_3$. The delay $d_2$ is substantially zero in this embodiment.

When the control voltage sets combination parameter C equal to 0, all of the signal circulates in loop ABCEA. This loop is referred to as the high frequency loop because it contains only 3 inverters and therefore for C=1 the period of the signal is equal to three times the gate delay of each of these inverters. Thus, for C=0, the frequency is equal to $1/6T_d$.

When the control voltage sets combination parameter C equal to 1, all of the signal circulates in loop ABCGA. This loop is referred to as the low frequency loop because it contains 5 inverters and therefore, for C=1, the frequency is equal to $1/10T_d$. Because the phase delay between points C and A varies monotonically from 0 to $2T_d$ as C varies from 0 to 1, the frequency varies monotonically from $1/6T_d$ to $1/10T_d$ as C varies from 0 to 1. Thus, this embodiment has a 5:3 ratio in the maximum and minimum frequencies generated by this oscillator. This oscillator is referred to as a 3/5 oscillator.

As discussed above, in order to avoid the oscillator failing to oscillate because its signal pegs at the positive or negative extremes of amplifier operation, both the low frequency and high frequency loops must have a net inversion. However, such inversion does not necessarily require an odd number of inverters in both loops. In FIG. 6 is illustrated an embodiment utilizing differential inverters in which an even number of inverters is utilized in both loops. To achieve the net inversion, the wires are crossed over as shown between inverters 62 and 63 but are not crossed over between the other elements. However, in other embodiments, the crossover could occur between combination circuit 61 and inverter 62 or between inverter 63 and node C. Similarly, it is not necessary that a pair of inverters be used in path CG. This pair of inverters can be replaced by an amplifier that provides the amplification and delay otherwise produced by inverters 64 and 65 or, in FIG. 5, produced by inverters 55 and 56.

The output signal can be tapped from this circuit at any point in the connections between elements 21-24. In the embodiment illustrated in FIG. 2, the signal $V_z$ is selected to be the output signal. However, the choice of output point can assist in increasing the maximum frequency attainable by this oscillator. In order to make this maximum frequency as large as possible for a given arrangement of inverters, the amount of loading of the high speed loop ABCEA should be minimized. Thus, in the embodiment in FIG. 5, the output voltage is tapped from the output of inverter 56. As a result of this, the signal at point C is amplified by passing through inverters 55 and 56 before it is tapped at point G. This results in less loading of the high speed loop ABCEA than if the output dignal were tapped at point A as in FIG. 2. An amplifier 57 is included in the output path to boost the amplitude of the output signal $V_{out}$. This choice also loads the low frequency loop more heavily so that the low frequency end is reduced, thereby somewhat increasing the tuning range.

It should be noted that, in FIG. 3, the angle P between $V_y$ and $V_x$ varies with C. This variation occurs because P equals $2*pi*f*(d_3-d_2)$ and f varies with C. As illustrated in FIG. 6, as C decreases toward zero, the frequency increases toward the maximum frequency of the oscillator. In FIG. 6 is illustrated the situation that will result if P approaches pi for some value of C near $\frac{1}{2}$. In this situation, the amplitude of $V_z$ becomes small enough that there may not be sufficient gain in other elements in the ring oscillator to achieve a net gain of at least 1, as is required to achieve and maintain oscillation. In this situation, when the amplitude of $V_z$ becomes too small, the circuit oscillation will cease.

If P approaches pi when C is nearer to 0 or 1 than it is to $\frac{1}{2}$, then this significant decrease in amplitude of $V_z$ may not occur. However, even in this case oscillator stability problems will arise. As is illustrated in FIG. 7, when there is a phase difference of pi between $V_x$ and $V_y$, then these two vectors will be collinear so that they no longer form a basis for the complex phasor plane. Once this point is reached, as C is further varied, $V_z$ will tend to stay collinear with vector $V_y$. Therefore, as C is varied further, the amplitude of $V_z$ will change, but the phase difference Q between $V_z$ and $V_y$ will not change. However, as C is varied through $C=\frac{1}{2}$, the amplitude of $V_z$ is forced to be zero so that the oscillator will cease to oscillate. Thus, in general, the inverter/combination circuit should be selected so that P is less than pi throughout the operating range of the oscillator. This requires that the number of inverters in the low frequency loop be less than twice the number of inverters in the high frequency loop. Unfortunately, this limits the range of tuning to less than an octave.

A ring oscillator that is tunable over a more more than one octave without becoming unstable can be produced by utilizing a plurality of inverter/combination circuits. In FIG. 9 is illustrated one embodiment in which three inverting variable delay (IVD) elements of FIG. 2 are connected in series in a ring to form a ring oscillator having a frequency range greater than one octave without being unstable. For the particular case in which element 23 is omitted from the inverting variable delay element 25, in which delay element 24 is a pair of inverters, and in which inverter/combination element consists of a combination element in series with an inverter, this inverting variable delay element introduces a delay that can vary from $T_d$ to $3T_d$. When $C=0$, the signal passes through three inverters so that the high frequency loop has a delay of $3T_d$. When $C=1$, the signal passes through nine inverters so that the low frequency loop has a delay of $9T_d$. Thus, this circuit exhibits a tuning range of 3:1, which compares to the tuning range of 5:3 of the oscillator of FIG. 5.

Figure 10:
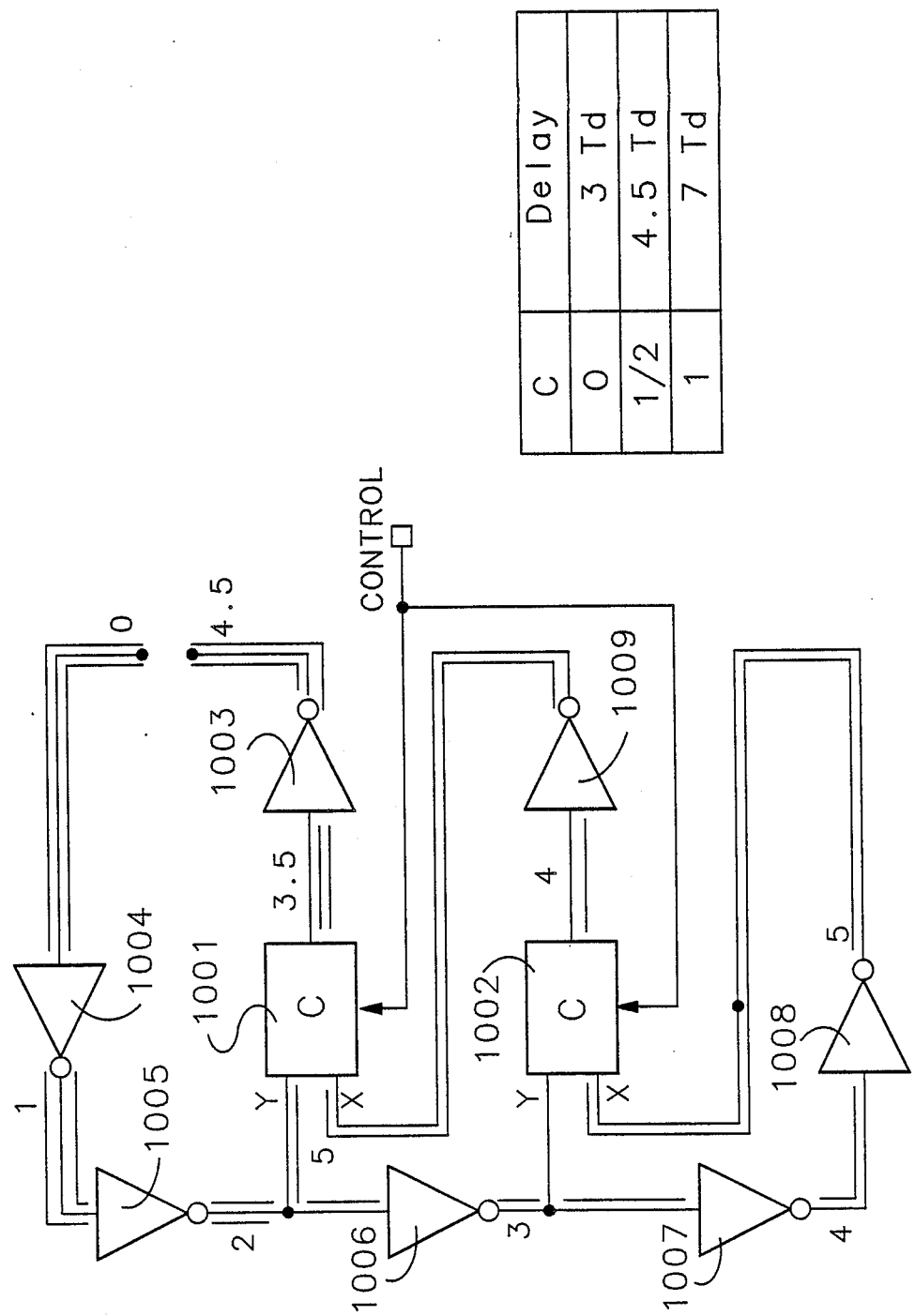
FIG. 10 is a block diagram of a ring oscillator utilizing a plurality of inverter/combination circuits connected in a cascade arrangement that not only achieves stable oscillation over an extended range of frequency, but also maintains a high maximum frequency of operation.

In FIG. 10 is shown an oscillator in which two inverter/combination elements are cascaded in a combination with some inverters to achieve an increased tuning range. This oscillator is achieved by replacing the constant delay produced by elements 55 and 56 in FIG. 5 with a noninverting variable delay block of elements identical to elements 52, 54, 55, 56 and 51 of FIG. 5. This circuit consists of a pair of combination circuits 1001 and 1002 plus a set of seven inverters 1003-1009.

That this circuit provides an extended frequency tuning range can be seen as follows. When $C=1$, combination circuits 1001 and 1002 are unresponsive to their x inputs. Therefore, the oscillator signal travels only around the loop consisting of elements 1001 and 1003-1005. This is the high frequency loop and contains three inverters so that the maximum frequency is $1/6T_d$. When $C=0$, combination circuits 1001 and 1002 are unresponsive to their y inputs so that the oscillator signal travels around the low frequency loop consisting of elements 1001, 1003-1008, 1002, and 1009 in series. This low frequency loop contains all seven inverters so that the minimum frequency of this oscillator is $1/14T_d$. Therefore, there is a 7:3 tuning range of this oscillator. In order to illustrate that for intermediate values of C that intermediate frequencies will be produced, the following simple analysis will show that for $C=\frac{1}{2}$, that the loop delay is 4.5 so that the frequency is $1/9T_d$ which is in the middle of the tuning range. When $C=\frac{1}{2}$, both inverters produce an equal mix of their input signals so that each has an output signal having a phase midway between the phases of its input signals. Starting at the upper right corner of this circuit as zero reference phase, to reach the output of each of inverters 1004-1008, the signal must pass through each of the preceding inverters in that path. Therefore, the phase delay at the output of each of these 5 inverters is 1, 2, 3, 4, and 5 times $T_d$ respectively. Since combination circuits 1001 and 1002 each produces at its output an equal mix of its two inputs, its output phase is the average of the phases of its two input signals. Therefore the delay at the output of combination element 1002 is 4, which means that the delay at the x input of combination circuit 1001 is 5. This delay on its x input and the delay of $2T_d$ on its y input means that the delay at the output of combination circuit 1001 is equal to 3.5. Therefore, the total delay is 4.5 $T_d$.

Figure 11:
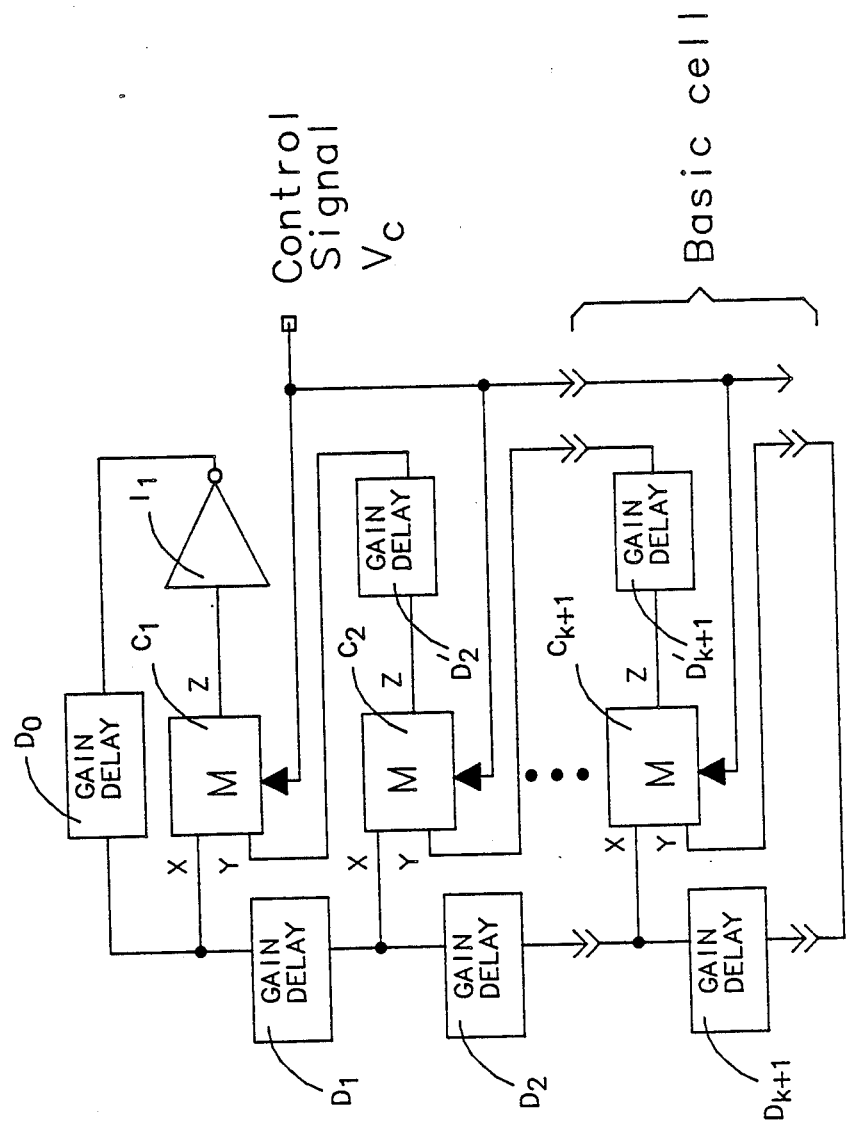
FIG. 11 presents a particular embodiment of the circuit of FIG. 10 to illustrate how the inverter/combination circuits function at values of C=0, ½ and 1 to determine the oscillator frequency.

The general structure of this extended tuning range oscillator is shown in FIG. 11. This circuit has N cascaded stages. The first stage contains a combination circuit 1111, an inverter 1112 and a gain delay element 1113 that provides both gain and delay of the signal through it. In the kth stage, for $k=2,\ldots,N$ for some integer N, there is a combination circuit $11k1$, and a pair of gain/delay elements $11k2$ and $11k3$. There is also an additional gain/delay element $11N4$. In the embodiment shown in FIG. 10, each of the gain delay elements is an inverter. In general, for $k=2-N-1$, elements $11k2$ and $11k3$ are required to be either both inverting or are both noninverting. Element $11N4$ is always noninverting. The delay for each of the elements $11k3$ can be freely chosen by the designer, but in general it will be advantageous to have increasing delay with increasing k. The gain and delay from elements $11k2$ for $=2,\ldots,N-1$ will in general be caused by the gain and delay that arise from real nonidealized combination circuits $11k1$.

Figure 12:
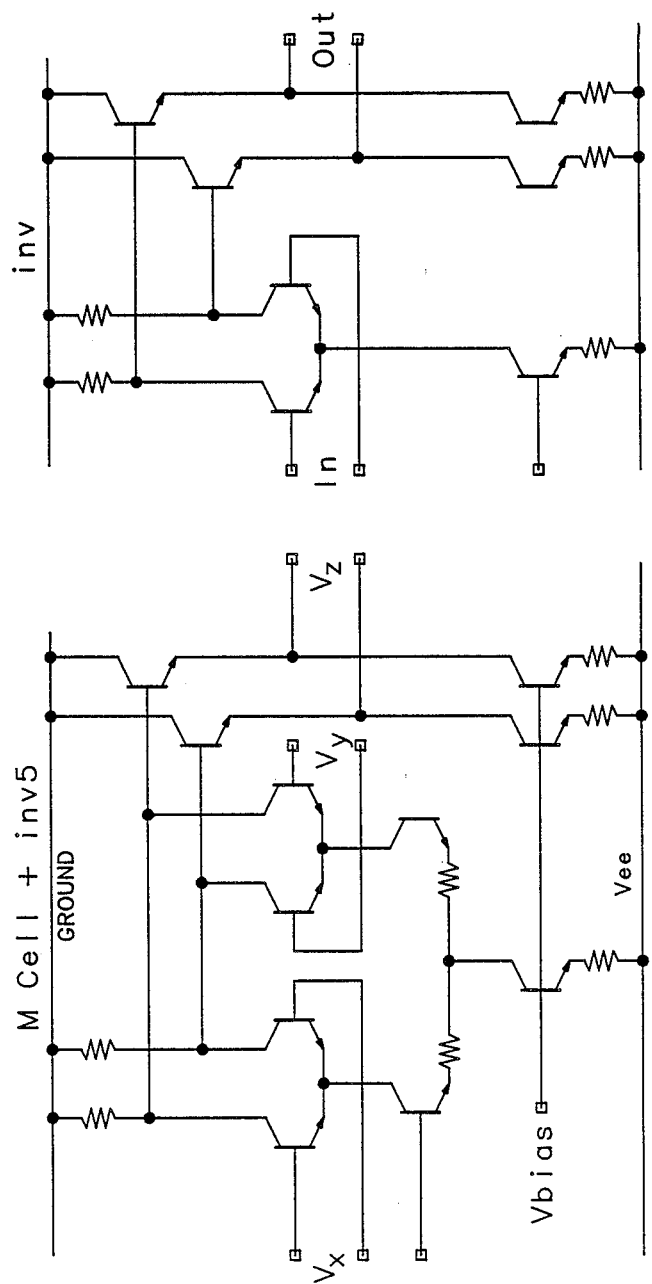
FIG. 12 is an embodiment of the inverter/combination cell and the inverter in bipolar circuitry.
Figure 13:
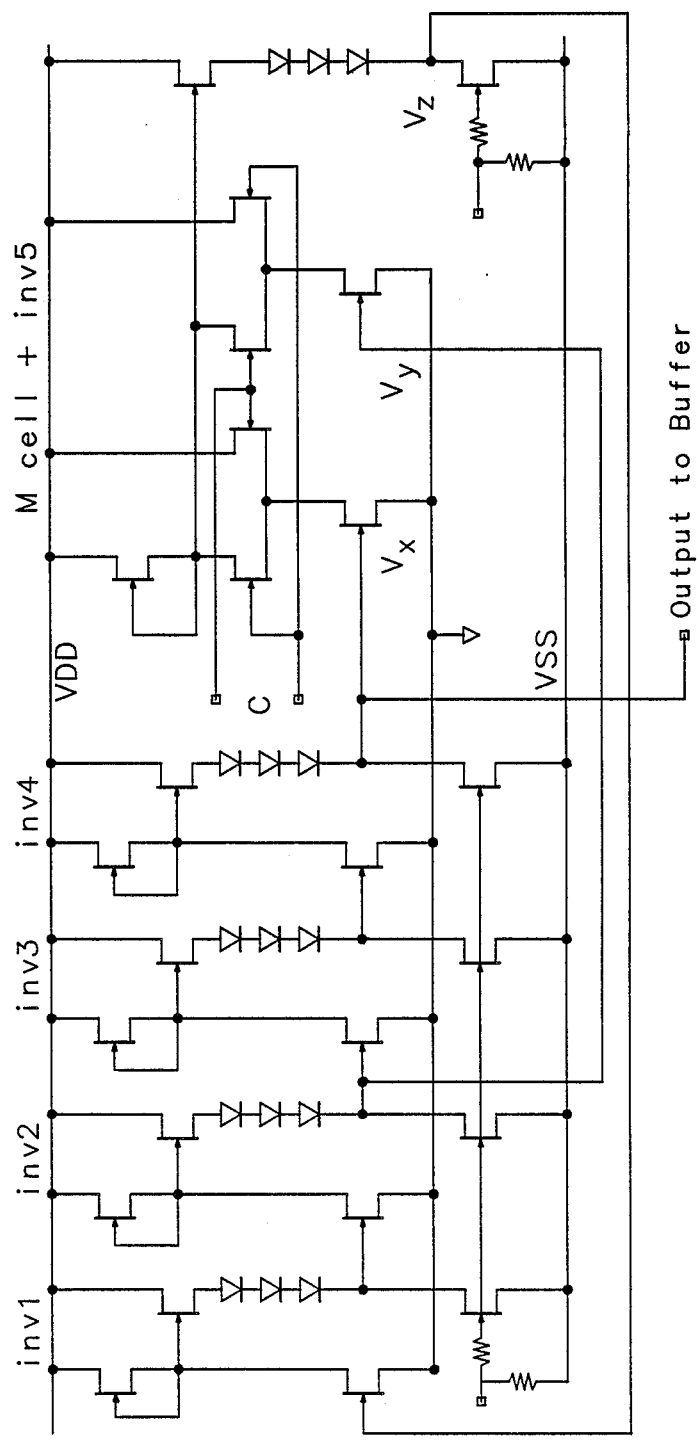
FIG. 13 is an embodiment of a ring oscillator utilizing FETs.

Actual embodiments of ring oscillators in accordance with this invention are shown in FIGS. 12 and 13. In FIG. 13, the inverter/combination cell and the inverter are implemented with bipolar elements. In FIG. 14, the oscillator is implemented using field effect transistors.

I claim:

1. A ring oscillator comprising:
   an inverter/combination element having a pair of inputs and an output;
   a first delay element having an input connected to the output of the inverter/combination element and having an output;

a second delay element having an input connected to the output of the first delay element and having an output connected to a first one of the inputs of the inverter/conbination element;

a third delay element having an input connected to the output of the first delay element and having an output connected to a second of the inputs of the inverter/conbination element; and an output port connected to any internal connection between the other elements of this oscillator.

* * * * *